United States Patent
Hiraishi et al.

[19]

[11] Patent Number: 5,858,088
[45] Date of Patent: Jan. 12, 1999

[54] DEVICE FOR LIFTING CRYSTAL BODIES

[75] Inventors: Yoshinobu Hiraishi; Mitsunori Kawabata, both of Omura; Hideki Tsuji, Yamato, all of Japan

[73] Assignee: Komatsu Ltd.

[21] Appl. No.: 17,763

[22] Filed: Feb. 3, 1998

[30] Foreign Application Priority Data

Feb. 4, 1997 [JP] Japan .................................. 9-021448

[51] Int. Cl.[6] .................................................. C30B 15/30
[52] U.S. Cl. .............................. 117/218; 117/14; 117/201; 117/202
[58] Field of Search ............................. 117/14, 201, 202, 117/218

[56] References Cited

U.S. PATENT DOCUMENTS

| | | | |
|---|---|---|---|
| 4,663,128 | 5/1987 | Helgeland et al. | 117/201 |
| 4,916,955 | 4/1990 | Katsuoka et al. | 117/218 |
| 5,254,319 | 10/1993 | Oda et al. | 117/218 |

*Primary Examiner*—Robert Kunemund
*Assistant Examiner*—Kin-Chan Chin
*Attorney, Agent, or Firm*—Welsh & Katz Ltd.

[57] ABSTRACT

The winding drum of the cable-winding device is kept air-tight by an air-tight container. A lower elastic sealing member 1a is interposed between the air-tight container and the rotation table. The air-tight container, the lower elastic sealing member 1a, and the chamber are communicated with one another. The air-tight container and the chamber are filled with inert gases at less than atmospheric pressure. The rotation table, the weight sensors, the drive motor, the gear are disposed in the atmosphere. An arm is vertically installed on the rotation table. An upper elastic sealing member 1b is interposed between the end portion of the arm and the air-tight container. The upper elastic sealing member is communicated the interior of the air-tight container through a through hole. The arm support the top portion of the upper elastic sealing member.

5 Claims, 4 Drawing Sheets

DEVICE FOR LIFTING CRYSTAL BODIES

FIELD OF THE INVENTION

This invention relates to a device for lifting crystal bodies, such as semiconductors, from the melt by a lifting apparatus. In particular, this invention relates to a device for lifting single-crystal bodies at a pressure less than atmospheric pressure within a lifting apparatus used for lifting semiconductor ingots, wherein said device is adapted to measure accurately the weight of the single-crystal being lifted so as to calculate its diameter.

DESCRIPTION OF PRIOR ART

In the process of lifting semiconductor single-crystal ingots by the CZ method, the weight of the single-crystal being lifted must be accurately measured to control the diameter of the single-crystal being lifted. The diameter must be kept at a desired value. If the diameter of a portion grows greater than the desired value, this portion must be ground by a grinding machine to have a diameter of the desired value.

The process for monitoring the diameter of the crystal bodies during lifting can be performed in two ways. One is to detect the size of the crystal body through its picture on a display, the other is calculating a diameter of the crystal body by detecting the increased amount of the weight of the crystal body being lifted.

Regarding the above, a method for measuring the increased weight of the crystal body has been disclosed in Unexamined Japanese Patent Publication No. 8-261903. In this publication, lifting means such as motors or gears are installed on a weight sensor, and the diameter of the crystal body is calculated by measuring the total weight of the lifting means and the increased amount of the weight of the crystal body through the weight sensor.

In the process of lifting a semiconductor material, for example single-crystal silicon, an inert gas must be filled in a chamber because the silicon-melt is extremely reactive with oxygen and nitrogen. Furthermore, the pressure in the chamber is set to be less than atmospheric pressure because the inert gas rapidly removing SiO amorphous, which is the product of reaction between the silicon-melt and the quartz-glass-made crucible used for charging the silicon-melt, by the expanding its volume. Therefore, it is preferable to perform the lifting operation within inert gases having a pressure lower than the atmosphere.

However, if the lifting operation is performed by use of the above-mentioned weight sensor within inert gas at less than atmospheric pressure, the cable-winding device and the weight sensor have to be made air-tight. In addition, the cable-winding device and the weight sensor have to communicate with the interior of the chamber. Therefore a huge air-tight container is required in order to make the cable-winding device and the weight sensor completely air-tight.

Furthermore, not only the air-tight container has to be made huge, but also the lubrication means for motors and gears should be those having very special specifications so as to keep the cable-winding device working at less than atmospheric pressure. Therefore, the manufacturing cost becomes very high.

SUMMARY OF THE INVENTION

In view of the above defects, the object of the present invention is to provide a device for lifting crystal. According to this invention, in the process of lifting crystal bodies at less than atmospheric pressure, it is possible to precisely perform the lifting operation by employing a lifting device of simple structure, without using any large-scale apparatus.

According to this invention, a device for lifting crystal bodies comprises a chamber, a rotation table installed on the top of the chamber, a weight sensor installed vertically on the upper surface of the rotation table, and a cable-winding device disposed on the top of the weight sensors. The winding drum of the cable-winding device is kept air-tight by an air-tight container, and the air-tight container is communicated with the chamber.

Furthermore, at least the winding drum of the cable-winding device is kept air-tight by the air-tight container, and a lower elastic sealing member is interposed between the bottom surface of the air-tight container and the rotation table. The air-tight container and the chamber are communicated by way of the lower elastic sealing member, and a top portion of an upper elastic sealing member is supported via an arm installed vertically on the upper surface of the rotation table and the bottom surface of the upper elastic sealing member is affixed to the top of the air-tight container. The interior of the upper elastic sealing member is communicated with the interior of the air-tight container.

According to this invention, the crystal body being lifted is monitored by the aid of measuring its increased weight, and the operation of the lifting device is controlled according to the detected weight. In order to perform lifting of semiconductor ingots at less than atmospheric pressure, only the lifting cable and the winding drum used for winding the lifting cable are kept air-tight. Other parts such as motor and gear, and weight sensors are disposed in the atmosphere.

Furthermore, the air-tight container in which the winding drum is disposed is installed on the weight sensors, which is installed vertically on the upper surface of the rotation table, and a lower elastic sealing member is interposed between the bottom surface of the air-tight container and the rotation table. The air-tight container and the chamber are communicated by way of the lower elastic sealing member.

Furthermore, to eliminate the error of the weight sensors induced by the variation of the pressure within the chamber, an arm installed vertically on the upper surface of the rotation table and extending to a location above the air-tight container is formed. The arm supports the top portion of the upper elastic sealing member communicating with the air-tight container and the bottom surface thereof is affixed on the air-tight container.

Therefore, according to this invention, there is no need to use a motor with special specifications in the lifting device, and conventional motors and gears can be used to construct the cable-winding device. Due to the fact that an air-tight lifting device can be constructed without a large-scale structure, manufacturing cost can be reduced.

Furthermore, by disposing both of the upper elastic sealing member and the lower elastic sealing member, weight errors induced by the variation of the pressure within the chamber can be eliminated, because the upward or downward forces caused within the air-tight container is cancelled.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENT

The lifting device of this embodiment detects an increased weight of the single-crystal being lifted so as to control the diameter of the single-crystal.

Figure 1:
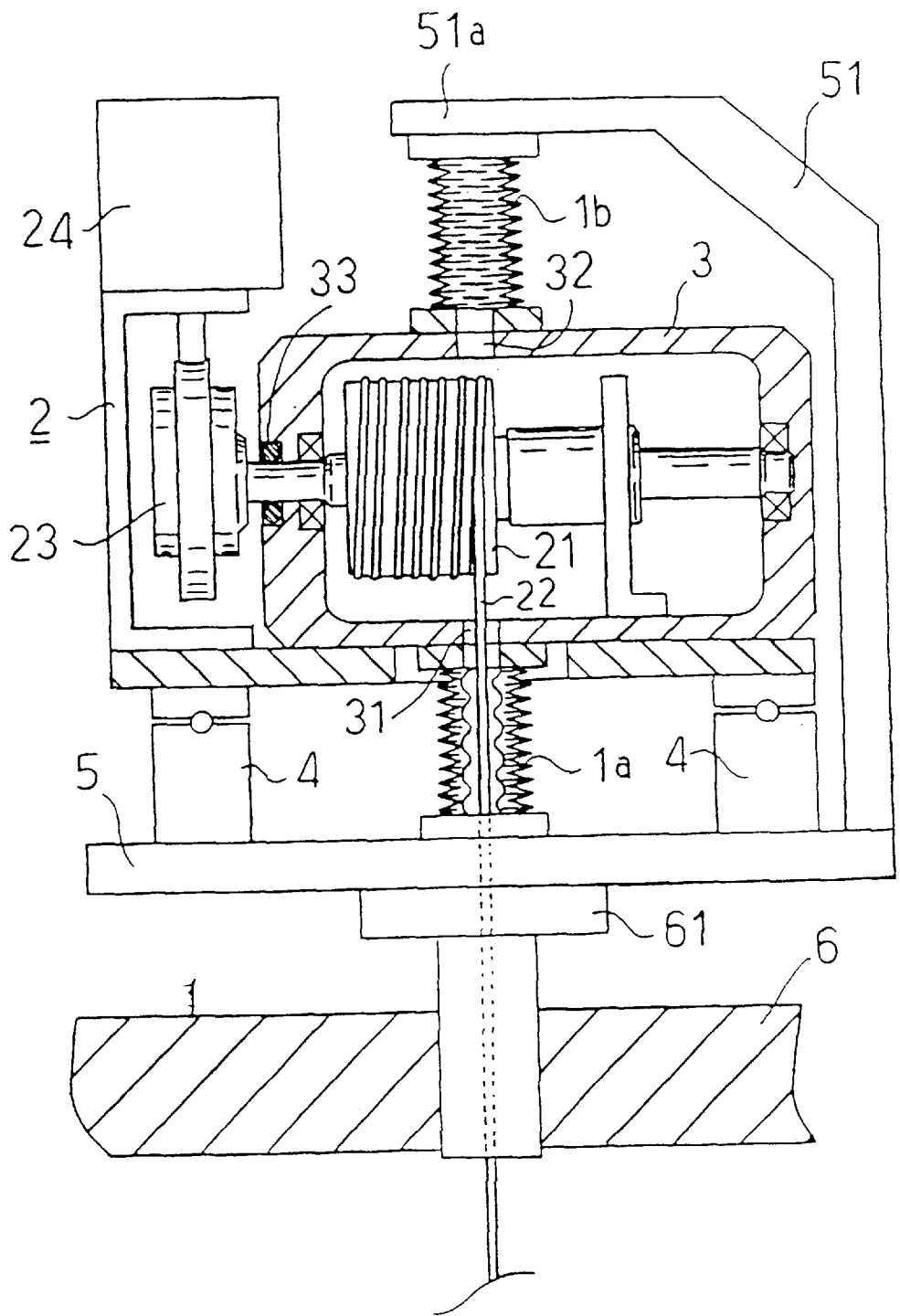
FIG. 1 is a partially cross-section side view showing the structure of the lifting device according to this invention.

As shown in FIG. 1, the lifting device of this invention comprises a chamber 6; a rotation table 5 installed on the top of the chamber via a pulley 61; two weight sensors 4, 4 installed vertically on the upper surface of the rotation table 5; and a cable-winding device 2 disposed on the top of the weight sensors 4, 4.

The cable-winding device 2 comprises a winding drum 21 for winding a cable 22; a drive motor 24 for rotating the winding drum 21; and a gear 23 for transmitting the rotation of the motor 24 to the winding drum 21. The winding drum 21 is placed in an air-tight container 3 to keep the air-tight condition.

A lower elastic sealing member (for example, bellows) 1a is interposed between the bottom surface of the air-tight container 3 and the top surface of the rotation table 5. In this embodiment, a wedding bellows made of stainless is used for the lower elastic sealing member. The rigidity of this bellows is 120 g/mm and rigidity ratio of the wedding bellows to the weight sensor is $1.6 \times 10^{-5}$.

A cable-passing hole 31 is formed in the bottom surface of the airtight container 3 and the cable-passing holes (not shown) are formed in the pulley 61 and the rotation table 5 respectively. And the cable 22 is suspended within the chamber 6 through the above cable-passing holes.

Therefore, the interior of the air-tight container 3 is communicated with the interior of the chamber 6 and filled with inert gas at less than atmospheric pressure. However, the rotation table 5, the weight sensors 4, the drive motor 24, and the gear are disposed outside the air-tight container 3 and the chamber 6, in other words, they are placed at atmospheric pressure.

Furthermore, a reversed L shaped arm 51 is vertically installed on the periphery of the rotation table 5, and the end portion 51a of the arm 51 is designed to be above the air-tight container 3. The arm supports the top portion of an upper elastic sealing member(for example, bellows) 1b by the end portion 51a thereof and a bottom surface of the upper elastic sealing member is affixed on air-tight container 3. The interior of the upper elastic sealing member 1b is communicated with the interior of the air-tight container 3 via a through hole 32. Therefore, just like the lower elastic sealing member 1a, the variation of pressure in the chamber 6 will influence that in the upper elastic sealing member 1b.

As shown in FIG. 1 the lower elastic sealing member 1a and the upper elastic sealing member 1b are aligned with each other along the same vertical line so as to prevent the weight sensors from receiving unequal forces which are generated by the variation of the pressure within the chamber 6. Therefore the measured values by the weight sensors 4 are almost unevenly distributed.

The following is a description of the operation of the lifting device according to the embodiment.

As shown in FIG. 1, the design calls for the total weight of the cable-winding device 2 and the cable 22 wound on the cable-winding device 2 to be exerted on the weight sensors 4. Since the total weight of the cable-winding device 2 and the cable 22 is known, the weight of the crystal body being lifted can be obtained by deducting the total weight of the cable-winding device 2 and the cable 22 from the total detected weight.

The lower elastic sealing member 1a is made of a high air-tight and elastic material so as not to affect the measuring by the weight sensors 4. The rigidity of this lower elastic sealing member 1a is less than ¹⁄₁₀₀ that of the weight sensors 4. A cylinder sealed by an O ring or diaphragm may be used for the lower elastic sealing member 1a and the upper elastic sealing member 1b.

The upper elastic sealing member 1b is installed so as to prevent the influence by the variation of the pressure in the chamber 6. This upper elastic sealing member 1b has a hollow therein.

In comparing with the lower elastic sealing member, the upper elastic sealing member has same such as said rigidity ratio and rigidity.

Figure 3:
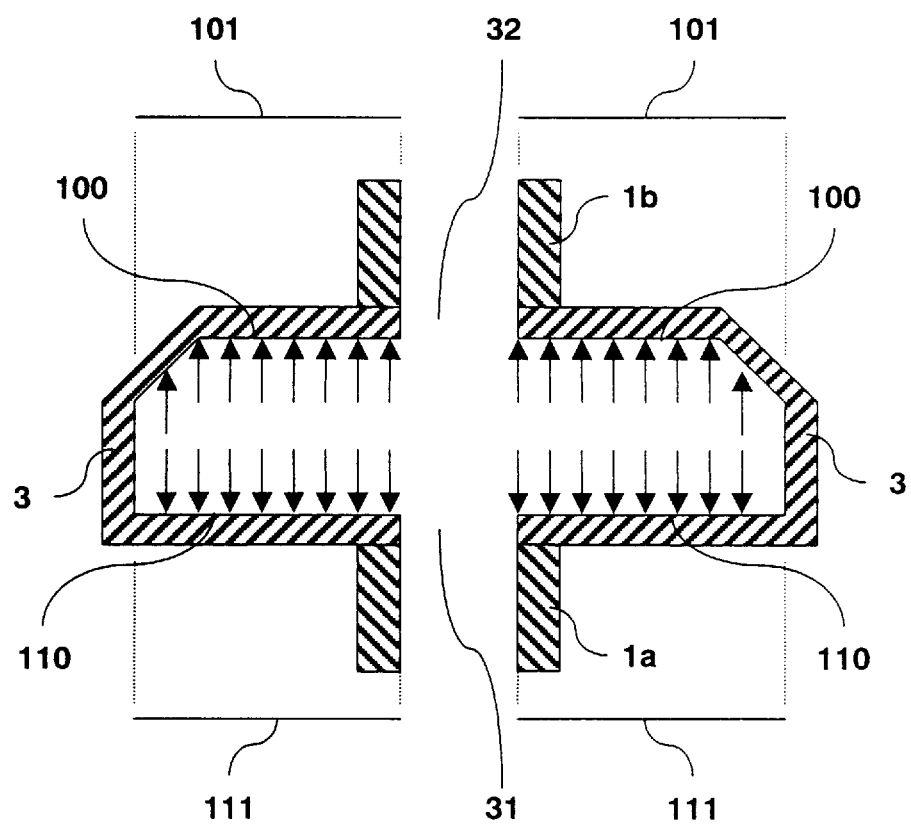
FIG. 3 is a schematic sectional view of the construction consisting of the air-tight container 3, the lower elastic sealing member 1a and upper elastic sealing member 1b.

FIG. 3 is a schematic sectional view of the construction consisting of the air-tight container 3, the lower elastic sealing member 1a and upper elastic sealing member 1b in which upward and downward components of the pressure in the air are indicated. As shown in this figure, the diameters of the holes formed in the lower elastic sealing member 1a and upper elastic sealing member 1b are determined such that the area of a plane 101, which is formed by projecting onto a horizontal plane the upper surface of the air-tight container 3 which is contacted with the inert gas is equal to the area of a plane 111, which is formed by projecting onto the horizontal plane the lower surface of the air-tight container 3 which is contacted with the inert gas. In practice, it is preferable to design that the inner diameters of the upper and lower surfaces are made equal.

For the lower elastic sealing member and the upper elastic sealing member, the inner hole of which is not in a cylindrical form, the diameter of the lower elastic sealing member and the upper elastic sealing member means average diameter.

Figure 4:
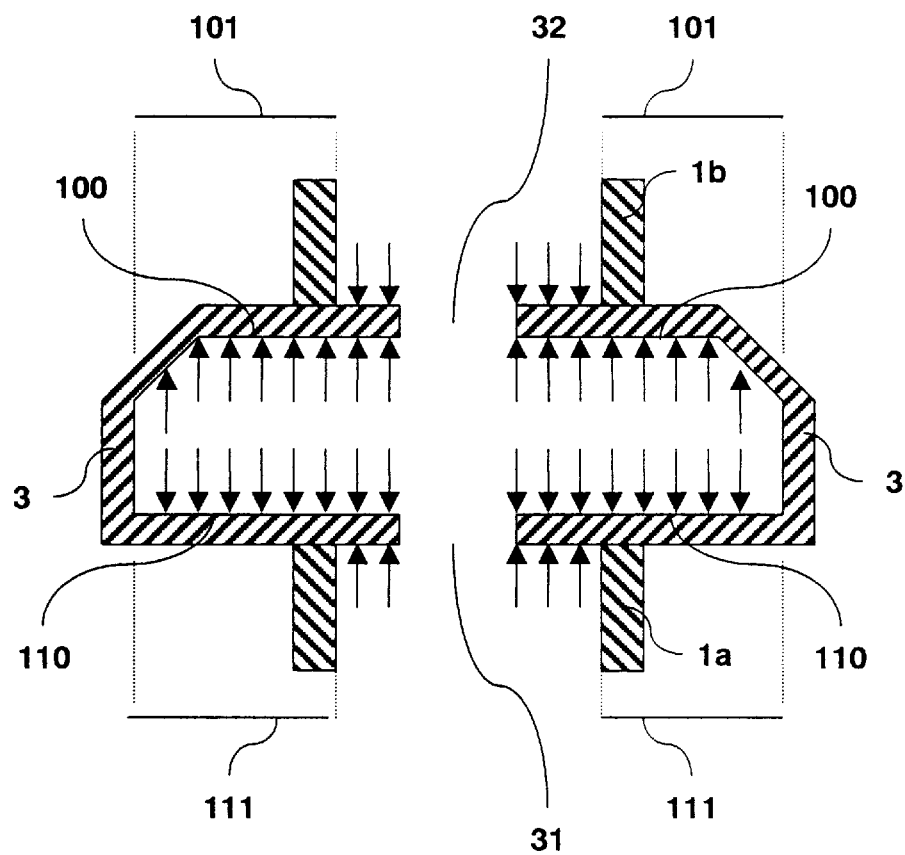
FIG. 4 is a schematic sectional view of the construction consisting of the air-tight container 3, the lower elastic sealing member 1a and upper elastic sealing member 1b.

In case that the inner diameters of the upper and lower surfaces of the elastic sealing members are greater than the diameter of the through hole 31 and 32 as shown in FIG. 4, the projected planes 101 and 111 are smaller in area than the projected planes 101 and 111 as shown in FIG. 3.

The upper elastic sealing member 1b has a shape substantially the same as that of the lower elastic sealing member 1a, therefore the forces applying to the weight sensors 4 are not generated by the pressure variation. This is because the area of the projected plane 101 is equal to the area of the projected plane 111. Furthermore, the upper elastic sealing member 1b is supported by the arm 51 that is vertically installed on the rotation table 5; therefore its basis is the same as that of the weight sensors 4, 4 installed on the rotation table 5.

As explained above, any forces in upward and downward direction induced against the air-tight container 3 are all cancelled and consequently do not affect the measuring result of the weight sensor 4. Additionally as above mentioned, if the lower elastic sealing member 1a and the upper elastic sealing member 1b is aligned along the same vertical line, the cancellation the forces can be performed more effectively.

The following is an illustration of the precision concerning the operation performed in the lifting device according to this invention.

Figure 2:
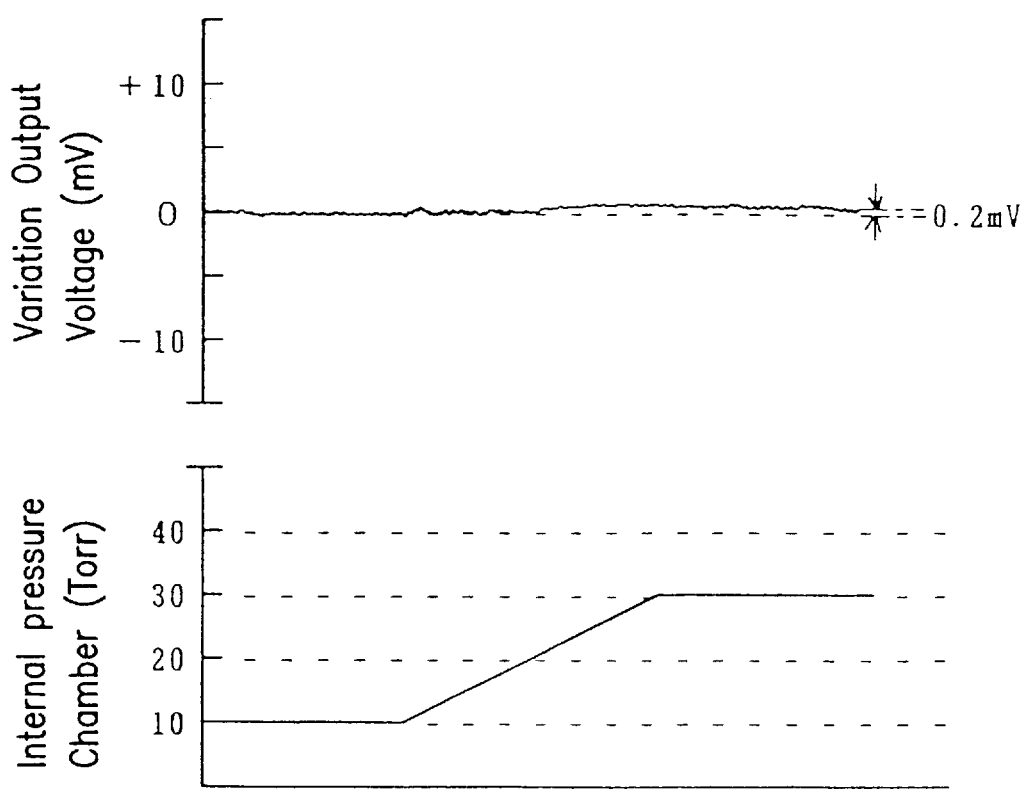
FIG. 2 is a graph showing the precision of the lifting device of the embodiment.

In order to check the precision of the lifting device, a preset weight was exerted on the cable wound up at a speed of 1 mm/min. During winding-up operation, the internal pressure of the chamber was raised from 10 Torr to 30 Torr, and the variation of the output of the weight sensor is shown in a graph. That is, as shown in FIG. 2, a maximum value of 0.2 mV for the variation of the output voltage coming from the weight sensors was recorded during the alteration of the internal pressure of the chamber. The above value corresponds to a weight of 3 g only, and the 3 g can be neglected in the process of lifting a silicon ingot weighing 150 kg.

Incidentally, the measured values by the weight sensors 4 may include an offset due to the deformation of the elastic sealing members. However, the offset does not affect measured values of the weight sensors 4 because only the increased amount of the weight of the single-crystal being lifted within a term is used to obtain an accurate value of the diameter.

The lifting device of this invention is constructed as above-described. Therefore, in the process of lifting crystal bodies at less than atmospheric pressure, there is no need to use expensive lubrication means with special specifications for motors and gears. The lubrication means for motors and gears is inexpensive and can actuate the device precisely. There is no need to enlarge the cable-winding device, thereby the cost can be thus reduced.

In addition, by the action of the upper elastic sealing member and the lower elastic sealing member, the weight of the cable-winding device can be correctly measured, and controlling of the lifting operation can be performed with high precision.

What is claimed is:

1. A device for lifting crystal bodies, comprises:

a chamber;

a rotation table installed on the chamber;

a weight sensor installed on the rotation table;

a cable-winding device disposed on the weight sensor, the cable-winding device including a winding drum;

an air-tight container for keeping the winding drum air-tight, the air-tight container being communicated with the chamber;

a lower elastic sealing member for surrounding a cable which is suspended from the winding drum into the chamber and for making the air-tight container communicate with the chamber;

an arm Installed on the rotation table and extending over the air-tight container; and a hollow upper elastic sealing member provided between an upper surface of the air-tight container and the arm, and communicated with the air-tight container, top portion thereof being supported by the arm.

2. A device for lifting crystal bodies as claimed in claim 1, wherein the upper surface of the air-tight container includes a first gas-contacting portion which is outside of a through-hole of the upper elastic sealing member and contact with an inner gas of the air-tight container, and a lower surface of the air-tight container includes a second gas-contacting portion which is outside a through-hole of the lower elastic sealing member and contact with the inner gas of the air-tight container, the first gas-contacting portion and the second gas-contacting portion having the same area when these portions are projected onto a horizontal plane.

3. A device for lifting crystal bodies as claimed in claim 2, wherein the through-hole of the upper elastic sealing member and the through-hole of the lower elastic sealing member have the same area when these through holes are projected onto the horizontal plane.

4. A device for lifting crystal bodies as claimed in claim 1, the upper and lower elastic sealing members have a rigidity which is equal to or less than $1/100$ times of a rigidity of the weight sensor.

5. A device for lifting crystal bodies, which comprises a chamber, a rotation table installed on top of the chamber, a weight sensor installed vertically on upper surface of the rotation table, and a wire-winding device disposed on top of the weight sensor, characterized in that:

at least a winding drum of the wire-winding device is kept air-tight by the air-tight container; a lower bellows is interposed between the bottom surface of the air-tight container and the rotation table; the air-tight container and the chamber are communicated by the way of the lower bellows, and an upper bellows supported via an arm installed vertically on upper surface of the rotation table is affixed to top of the air-tight container; and interior of the upper bellows is communicated with interior of the air-tight container.

* * * * *

UNITED STATES PATENT AND TRADEMARK OFFICE
CERTIFICATE OF CORRECTION

PATENT NO. : 5,858,088
DATED : January 12, 1999
INVENTOR(S) : Hiraishi et al.

It is certified that error appears in the above-identified patent and that said Letters Patent is hereby corrected as shown below:

On the cover page, item 73, please change Assignee's name from "Komatsu, Ltd." to --Komatsu Electronic Metals Co., Ltd.--

Signed and Sealed this

Seventh Day of December, 1999

Attest:

Q. TODD DICKINSON

*Attesting Officer*  *Acting Commissioner of Patents and Trademarks*